(12) United States Patent
Kim

(10) Patent No.: US 12,284,809 B2
(45) Date of Patent: Apr. 22, 2025

(54) SEMICONDUCTOR MEMORY DEVICE AND METHOD OF MANUFACTURING THE SAME

(71) Applicant: SK hynix Inc., Icheon-si (KR)

(72) Inventor: Jae Taek Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 411 days.

(21) Appl. No.: 17/737,479

(22) Filed: May 5, 2022

(65) Prior Publication Data

US 2023/0200068 A1 Jun. 22, 2023

(30) Foreign Application Priority Data

Dec. 17, 2021 (KR) .................. 10-2021-0182113

(51) Int. Cl.
| | |
|---|---|
| H10B 43/27 | (2023.01) |
| H10B 41/27 | (2023.01) |
| H10B 41/35 | (2023.01) |
| H10B 43/35 | (2023.01) |

(52) U.S. Cl.
CPC ............ *H10B 43/27* (2023.02); *H10B 41/27* (2023.02); *H10B 41/35* (2023.02); *H10B 43/35* (2023.02)

(58) Field of Classification Search
None
See application file for complete search history.

(56) References Cited

U.S. PATENT DOCUMENTS

2021/0217468 A1*  7/2021  Lee ..................... H10B 43/27

FOREIGN PATENT DOCUMENTS

| KR | 1020210023291 A | 3/2021 |
|---|---|---|
| KR | 1020210028249 A | 3/2021 |

* cited by examiner

*Primary Examiner* — Anthony Ho
(74) *Attorney, Agent, or Firm* — WILLIAM PARK & ASSOCIATES LTD.

(57) ABSTRACT

A semiconductor memory device, and a method of manufacturing the same, includes a gate stacked body including interlayer insulating layers and conductive patterns that are alternately stacked on a substrate in a vertical direction, a channel structure penetrating at least a portion of the gate stacked body and having a first end protruding upward higher than the gate stacked body, a memory layer enclosing a sidewall of the channel structure, and a source layer formed on the gate stacked body. The channel structure includes a core insulating layer formed in a central region of the channel structure and extending in a vertical direction, and a channel layer enclosing a sidewall of the core insulating layer and formed to be higher than the core insulating layer and the memory layer in the vertical direction.

12 Claims, 17 Drawing Sheets

SEMICONDUCTOR MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2021-0182113 filed on Dec. 17, 2021, in the Korean Intellectual Property Office, the entire disclosure of which is incorporated by reference herein.

BACKGROUND

1. Technical Field

Various embodiments of the present disclosure relate to an electronic device, and more particularly, to a semiconductor memory device having a vertical channel structure and a method of manufacturing the semiconductor memory device.

2. Related Art

Recently, a paradigm for a computer environment has been converted into ubiquitous computing so that computer systems can be used anytime and anywhere. Due to this, the use of portable electronic devices such as mobile phones, digital cameras, and notebook computers has rapidly increased. In general, such portable electronic devices use a memory system which employs a semiconductor memory device, in other words, use a data storage device. The data storage device is used as a main memory device or an auxiliary memory device for portable electronic devices.

A data storage device using a semiconductor memory device is advantageous in that, because there is no mechanical driving part, stability and durability are excellent, information access speed is high, and power consumption is low. The data storage device, as examples of the memory system having such advantages, includes a universal serial bus (USB) memory device, memory cards having various interfaces, a solid state drive (SSD), etc.

Semiconductor memory devices are generally classified as volatile memory devices or nonvolatile memory devices. A nonvolatile memory device has a comparatively low write and read speed, but retains data stored therein even when the supply of power is interrupted. Therefore, the nonvolatile memory device is used to store data to be retained regardless of whether power is supplied. Representative examples of memory used in nonvolatile memory devices include read-only memory (ROM), mask ROM (MROM), programmable ROM (PROM), erasable programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), etc. Flash memory is classified as NOR type or NAND type.

SUMMARY

Various embodiments of the present disclosure are directed to a semiconductor memory device, which, for an embodiment, can more easily perform a process for coupling a channel layer having a vertical channel structure and a source layer to each other, and a method of manufacturing the semiconductor memory device.

In accordance with an embodiment of the present disclosure is a semiconductor memory device that may include a gate stacked body including interlayer insulating layers and conductive patterns that are alternately stacked on a substrate in a vertical direction, a channel structure penetrating at least a portion of the gate stacked body and having a first end protruding upward higher than the gate stacked body, a memory layer enclosing a sidewall of the channel structure, and a source layer formed on the gate stacked body. The channel structure may include a core insulating layer formed in a central region of the channel structure and extending in a vertical direction, and a channel layer enclosing a sidewall of the core insulating layer and formed to be higher than the core insulating layer and the memory layer in the vertical direction.

In accordance with an embodiment of the present disclosure is a semiconductor memory device that may include a gate stacked body including interlayer insulating layers and conductive patterns that are alternately stacked on a substrate in a vertical direction; a sacrificial substrate formed on the gate stacked body; a channel structure penetrating at least a portion of the gate stacked body and the sacrificial substrate, the channel structure having a first end protruding upward from the sacrificial substrate; a memory layer enclosing a sidewall of the channel structure; and a source layer formed on the gate stacked body. The protruding first end of the channel structure may include an opening.

In accordance with the present disclosure is a method of manufacturing a semiconductor memory device. The method may include: forming a memory cell array on a first substrate such that the memory cell array includes a gate stacked body including interlayer insulating layers and conductive patterns alternately stacked in a vertical direction, a core insulating layer penetrating at least a portion of the gate stacked body and having a first end extending into the first substrate, a channel layer enclosing a sidewall and the first end of the core insulating layer, and a memory layer extending from an area between the channel layer and the gate stacked body to an area between an end of the channel layer and the first substrate; performing a first etching process of etching the first substrate, the memory layer, and the channel layer such that the first end of the core insulating layer is exposed; performing a second etching process of etching the exposed core insulating layer to a certain thickness, and then causing the channel layer to protrude such that a height of an upper portion of the channel layer is greater than a height of an upper portion of the core insulating layer; and forming a first source layer to enclose the protruding channel layer.

DETAILED DESCRIPTION

Specific structural or functional descriptions for embodiments of the present disclosure introduced in this specification or application are exemplified to describe embodiments according to the concept of the present disclosure. The embodiments according to the concept of the present disclosure may be practiced in various forms and should not be construed as being limited to the embodiments described in the specification or application.

Various embodiments of the present disclosure will now be described more fully hereinafter with reference to the accompanying drawings, in which embodiments of the present disclosure are shown, so that those skilled in the art can easily practice the technical spirit of the present disclosure.

Figure 1:
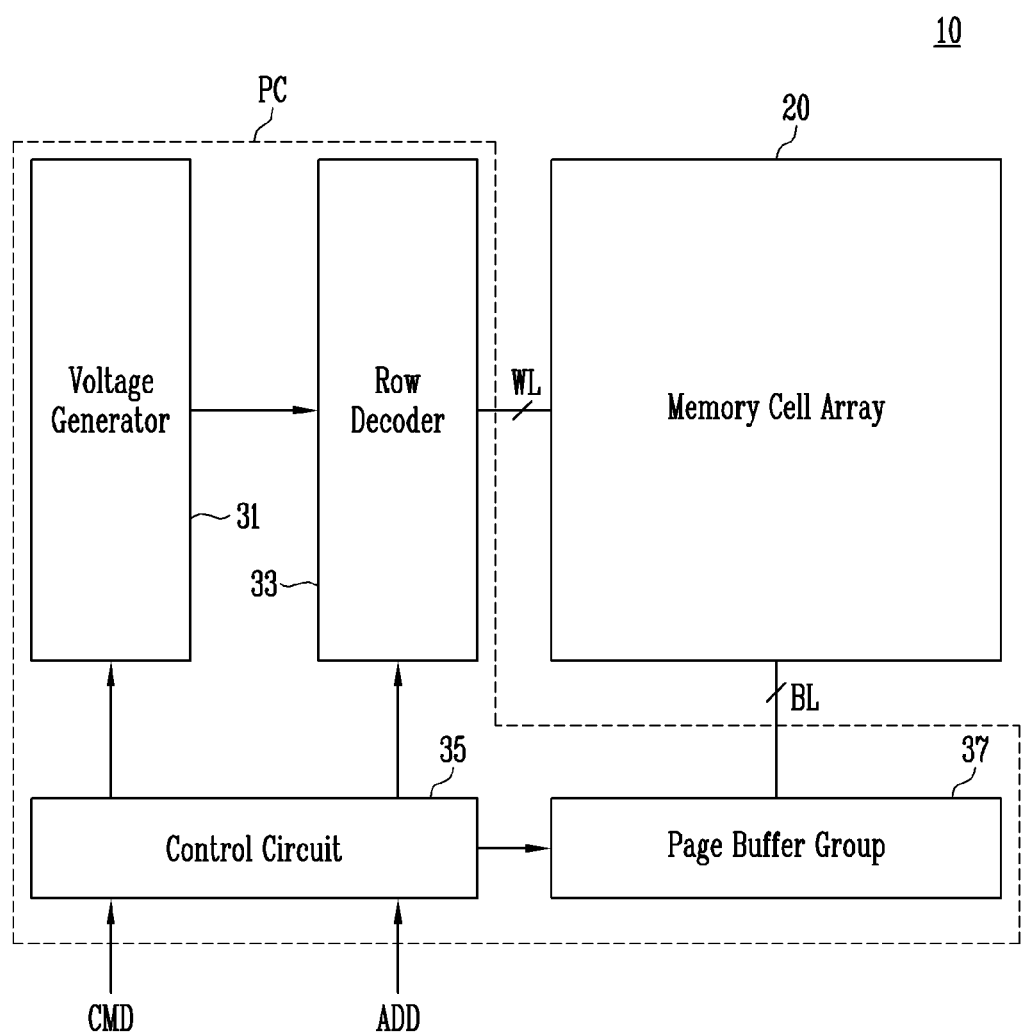
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 10 includes a peripheral circuit PC and a memory cell array 20.

The peripheral circuit PC may control a program operation of storing data in the memory cell array 20, a read operation of outputting data stored in the memory cell array 20, and an erase operation of erasing data stored in the memory cell array 20.

In an embodiment, the peripheral circuit PC may include a voltage generator 31, a row decoder 33, a control circuit 35, and a page buffer group 37.

The memory cell array 20 may include a plurality of memory blocks. The memory cell array 20 may be coupled to the row decoder 33 through word lines WL, and may be coupled to the page buffer group 37 through bit lines BL.

The control circuit 35 may control the voltage generator 31, the row decoder 33, and the page buffer group 37 in response to a command CMD and an address ADD.

The voltage generator 31 may generate various operating voltages, such as an erase voltage, a ground voltage, a program voltage, a verify voltage, a pass voltage, and a read voltage, which are used for a program operation, a read operation, and an erase operation, under the control of the control circuit 35.

The row decoder 33 may select a memory block under the control of the control circuit 35. The row decoder 33 may apply the operating voltages to the word lines WL coupled to the selected memory block.

The page buffer group 37 may be coupled to the memory cell array 20 through the bit lines BL. The page buffer group 37 may temporarily store data received from an input/output circuit (not illustrated) under the control of the control circuit 35 during a program operation. The page buffer group 37 may sense voltages or currents of the bit lines BL under the control of the control circuit 35 during a read operation or a verify operation. The page buffer group 37 may select the bit lines BL under the control of the control circuit 35.

Structurally, the memory cell array 20 may overlap part of the peripheral circuit PC.

Figure 2:
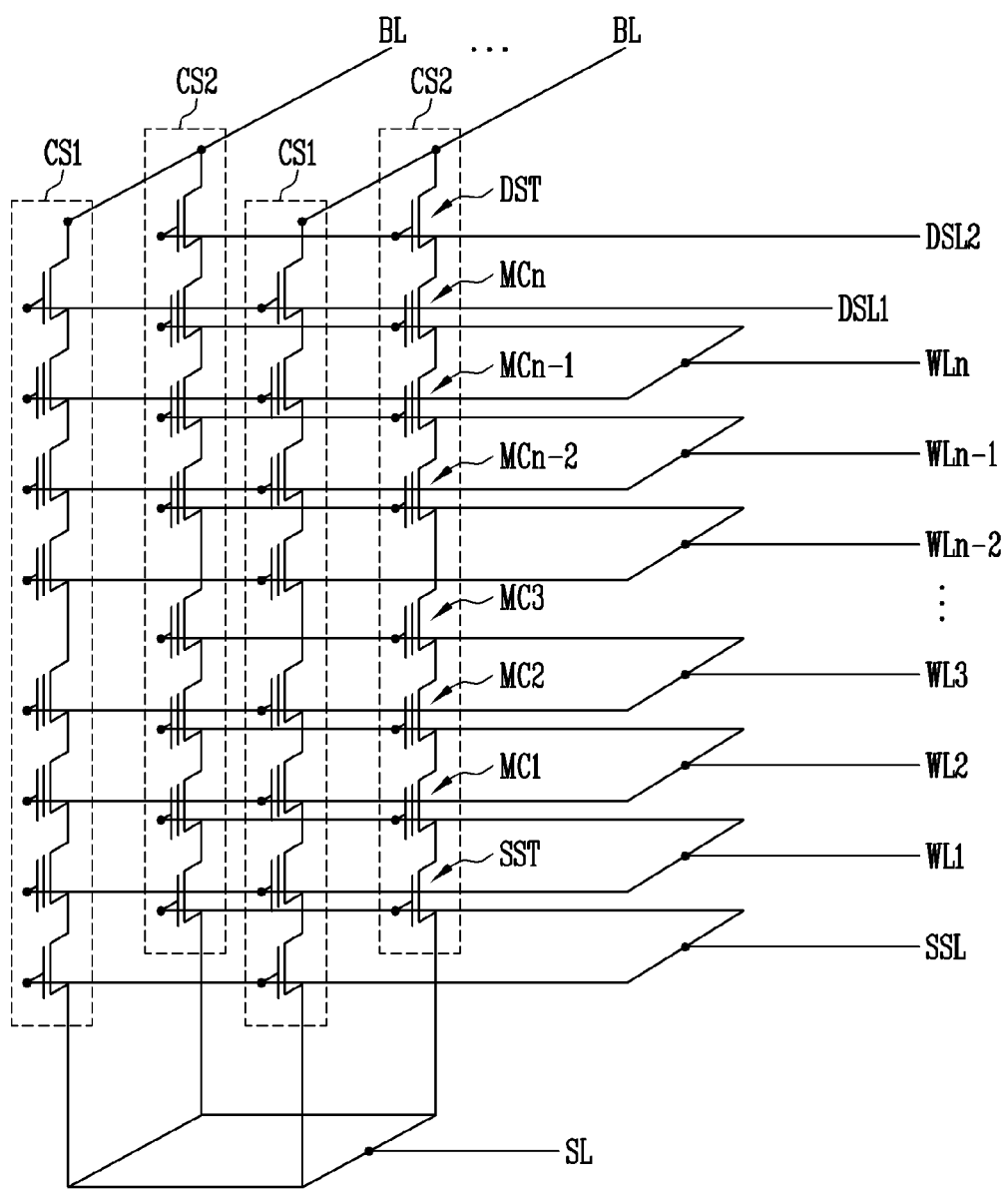
FIG. 2 is a circuit diagram for describing a memory cell array of FIG. 1.

FIG. 2 is a circuit diagram for describing the memory cell array of FIG. 1.

Referring to FIG. 2, the memory cell array 20 may include a plurality of cell strings CS1 and CS2 coupled between a source line SL and a plurality of bit lines BL. The plurality of cell strings CS1 and CS2 may be coupled in common to a plurality of word lines WL1 to WLn.

Each of the plurality of cell strings CS1 and CS2 may include at least one source select transistor SST coupled to the source line SL, at least one drain select transistor DST coupled to the corresponding bit line BL, and a plurality of memory cells MC1 to MCn connected in series to each other between the source select transistor SST and the drain select transistor DST.

Gates of the plurality of memory cells MC1 to MCn may be respectively coupled to the plurality of word lines WL1 to WLn stacked to be spaced apart from each other. The plurality of word lines WL1 to WLn may be arranged between a source select line SSL and two or more drain select lines DSL1 and DSL2. The two or more drain select lines DSL1 and DSL2 may be spaced apart from each other at the same level.

A gate of the source select transistor SST may be coupled to the source select line SSL. A gate of the drain select transistor DST may be coupled to a drain select line corresponding to the gate of the drain select transistor DST.

The source line SL may be coupled to a source of the source select transistor SST. A drain of the drain select transistor DST may be coupled to a bit line corresponding to the drain of the drain select transistor DST.

The plurality of cell strings CS1 and CS2 may be divided into string groups coupled to the two or more drain select lines DSL1 and DSL2, respectively. Cell strings coupled to the same word line and the same bit line may be independently controlled by different drain select lines. Further, cell strings coupled to the same drain select line may be independently controlled by different bit lines.

In an embodiment, two or more drain select lines DSL1 and DSL2 may include a first drain select line DSL1 and a second drain select line DSL2. The plurality of cell strings CS1 and CS2 may include first cell strings CS1 of a first string group coupled to the first drain select line DSL1 and second cell strings CS2 of a second string group coupled to the second drain select line DSL2.

Figure 3:
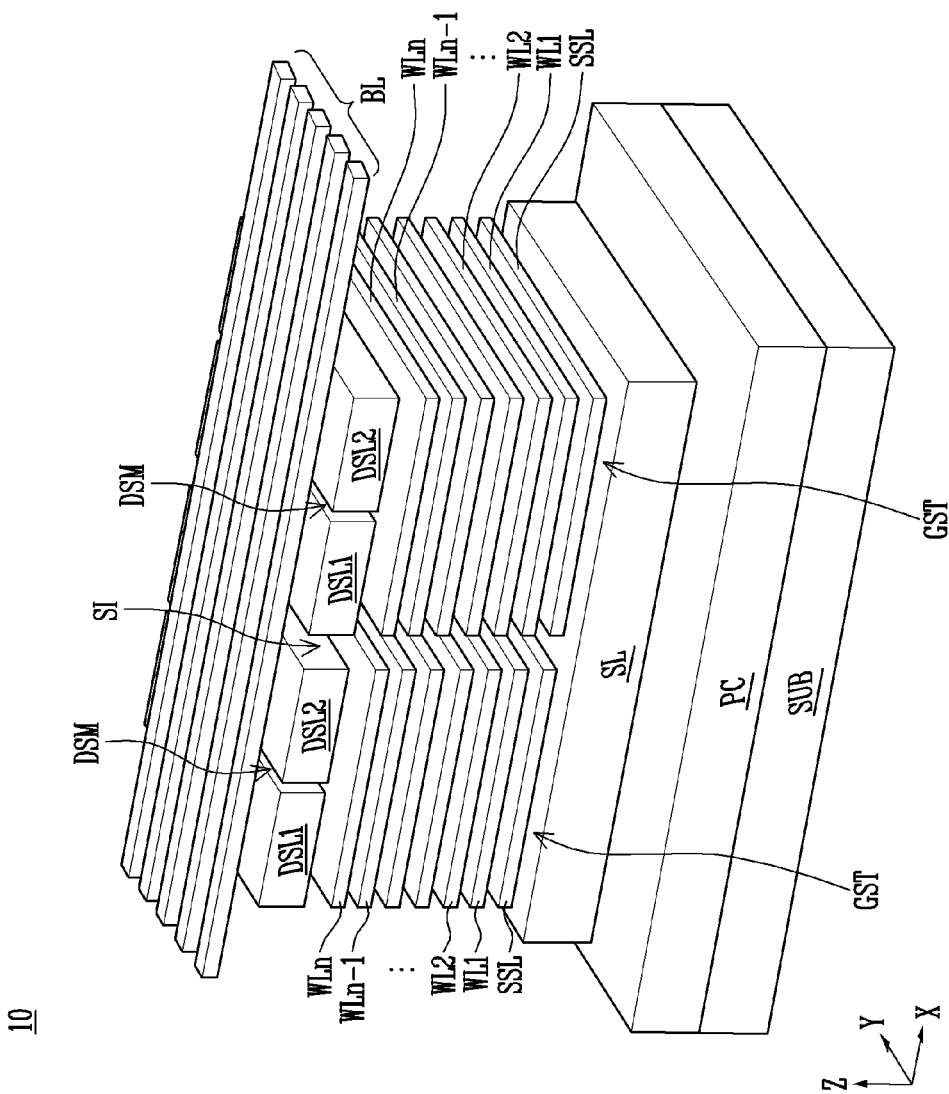
FIG. 3 is a perspective view schematically illustrating a semiconductor memory device according to an embodiment of the present disclosure.

FIG. 3 is a perspective view schematically illustrating a semiconductor memory device according to an embodiment of the present disclosure.

Referring to FIG. 3, a semiconductor memory device 10 may include a peripheral circuit PC arranged on a substrate SUB and gate stacked bodies GST overlapping the peripheral circuit PC.

Each of the gate stacked bodies GST may include a source select line SSL, a plurality of word lines WL1 to WLn, and two or more drain select lines DSL1 and DSL2 separated from each other at the same level by a separation structure DSM.

The source select line SSL and the plurality of word lines WL1 to WLn may extend in a first direction X and a second direction Y, and may be formed in planar shapes parallel to each other on the upper surface of the substrate SUB. The first direction X may be the direction of an X axis in an XYZ coordinate system, and the second direction Y may be the direction of a Y axis in the XYZ coordinate system.

The plurality of world lines WL1 to WLn may be stacked to be spaced apart from each other in a third direction Z. The third direction Z may be the direction of a Z axis in the XYZ coordinate system. The plurality of word lines WL1 to WLn may be arranged between the two or more drain select lines DSL1 and DSL2 and the source select line SSL.

The gate stacked bodies GST may be separated from each other by a slit SI. The separation structure DSM may be formed to be shorter than the slit SI in the third direction Z, and may overlap the plurality of word lines WL1 to WLn.

Each of the separation structure DSM and the slit SI may extend in a linear shape, a zigzag shape, or a wave shape. The width of each of the separation structure DSM and the slit SI may be variously changed according to design specifications.

The source select line SSL according to an embodiment may be arranged closer to the peripheral circuit PC than the two or more drain select lines DSL1 and DSL2.

The semiconductor memory device 10 may include a source line SL disposed between the gate stacked bodies GST and the peripheral circuit PC and a plurality of bit lines BL, spaced farther apart from the peripheral circuit PC than the source line SL. The gate stacked bodies GST may be disposed between the plurality of bit lines BL and the source line SL.

Figure 4:
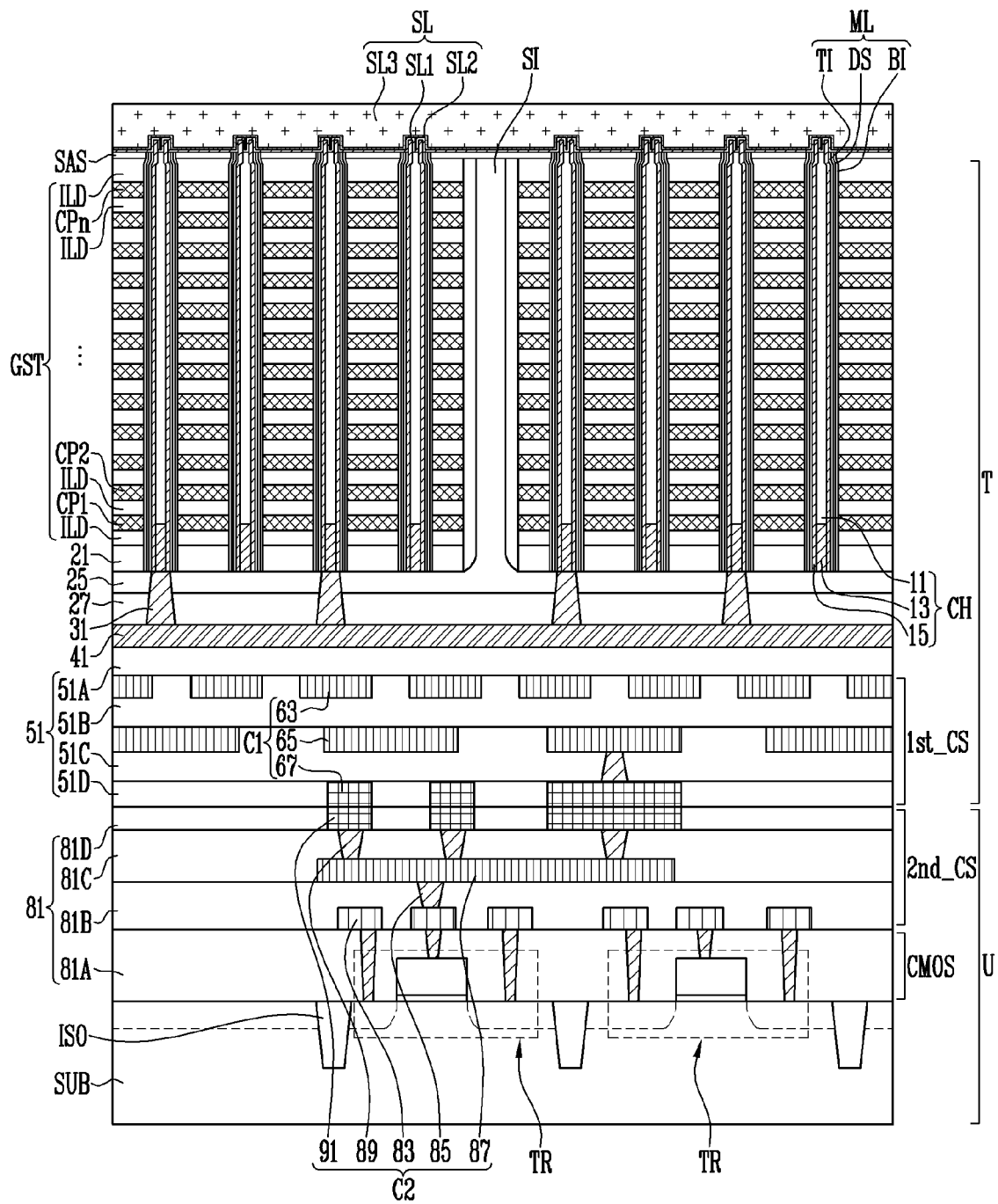
FIG. 4 is a sectional view for describing the memory cell array of FIG. 1.

FIG. 4 is a sectional view for describing the memory cell array 20 of FIG. 1.

Referring to FIG. 4, the memory cell array 20 may be configured such that a lower structure U and an upper structure T are adhered to each other and a source line structure SL is disposed on the upper structure T.

The upper structure T may include gate stacked bodies GST separated from each other by a slit SI, channel structures CH penetrating at least portions of the gate stacked bodies GST, a memory layer ML extending along the sidewall of each of the channel structures CH, and a bit line 41 and a first coupling structure 1st_CS, which are disposed below the gate stacked bodies GST.

Each gate stacked body GST may include interlayer insulating layers ILD and conductive patterns CP1 to CPn that are alternately stacked in a vertical direction. Each of the conductive patterns CP1 to CPn may include various conductive materials, such as a doped silicon layer, a metal layer, a metal silicide layer, and a barrier layer, and may include two or more types of conductive materials. For example, each of the conductive patterns CP1 to CPn may include tungsten and a titanium nitride layer TIN configured to enclose the surface of the tungsten. Tungsten is a low-resistance material and is capable of decreasing the resistance of the conductive patterns CP1 to CPn. The titanium nitride layer TiN may be a barrier layer, and may prevent tungsten and the interlayer insulating layers ILD from directly contacting each other.

The first conductive pattern CP1 adjacent to the bit line 41, among the conductive patterns CP1 to CPn, may be used as a drain select line DSL. In other embodiments, conductive patterns of two or more layers, which are adjacent to the bit line 41 and are successively stacked, may be used as drain select lines. Among the conductive patterns CP1 to CPn, an n-th conductive pattern CPn adjacent to a first source layer SL1, a second source layer SL2, and a third source layer SL3 may be used as the source select line SSL. In various embodiments, conductive patterns of two or more layers, which are adjacent to the first source layer SL1, the second source layer SL2, and the third source layer SL3 and are successively stacked, may be used as source select lines. The conductive patterns (e.g., CP2 to CPn−1), which are adjacent to each other in a vertical direction and are disposed between the drain select line and the source select line, may be used as word lines WL1 to WLn, described above with reference to FIG. 2.

Each channel structure CH may vertically penetrate at least a portion of the gate stacked body GST, and the first end of the channel structure CH may be formed to protrude higher than the gate stacked body GST. Each channel structure CH may be formed to be hollow. The channel structure CH may include a core insulating layer 11 configured to fill a central region of the channel structure CH, a doped semiconductor layer 13 disposed below the core insulating layer 11, and a channel layer 15 configured to enclose the surfaces of the core insulating layer 11 and the doped semiconductor layer 13. The channel layer 15 may be used as a channel area for a cell string corresponding thereto. The channel layer 15 may be formed of a semiconductor material. In an embodiment, the channel layer 15 may include a silicon layer. A dopant may be implanted into a portion disposed in an uppermost portion of the channel layer 15, i.e., a portion corresponding to the source select transistor, through an ion implantation process. The channel structure CH may be formed to protrude higher than the interlayer insulating layer ILD disposed in an uppermost portion of the gate stacked body GST. The end of the protruding channel structure CH might be formed only of the channel layer 15. For example, the channel layer 15 may be formed to have a height greater than that of the interlayer insulating layer ILD disposed in the uppermost portion of the gate stacked body GST. For example, the channel layer 15 may be formed to have a height greater than that of the core insulating layer 11. That is, the channel layer 15 may be formed to protrude upward higher than the core insulating layer 11.

The memory layer ML may be formed to enclose the surface of the channel structure CH. The memory layer ML may include a tunnel insulating layer TI configured to enclose the channel layer 15 of the channel structure CH, a data storage layer DS configured to enclose the tunnel insulating layer TI, and a blocking insulating layer BI configured to enclose the data storage layer DS. The memory layer ML may extend from the channel structure CH in a vertical direction, and may extend short of the channel layer 15. That is, the memory layer ML may be formed to have a height less than that of the channel layer 15. That is, the channel layer 15 may be disposed between the memory layer ML and the core insulating layer 11, and may have a height greater than that of the memory layer ML and the core insulating layer 11. Accordingly, an opening may be formed in an upper portion of the core insulating layer 11 due to the height of the channel layer 15, and may be filled with the first source layer SL1 and the second source layer SL2. The memory layer ML may be formed at a height equal to or greater than that of the interlayer insulating layer IDL disposed in the uppermost portion of the gate stacked body GST. The memory layer ML may be defined as a component included in the channel structure CH.

A sacrificial substrate SAS may be further disposed between the interlayer insulating layer ILD disposed in the uppermost portion of the gate stacked body GST and the first source layer SL1.

The bit line 41 may be disposed below the gate stacked body GST. The bit line 41 may be coupled to the channel structures CH through contact plugs 31 penetrating at least portions of a plurality of insulating layers 21, 25, and 27. The bit line 41 may be spaced apart from the substrate SUB by a first insulating structure 51 and a second insulating structure 81.

The first coupling structure 1st_CS may include the first insulating structure 51 and first connection structures C1 formed in the first insulating structure 51. The first connection structures C1 may include various conductive patterns 63, 65, and 67. The first insulating structure 51 may include two or more insulating layers 51A to 51D stacked between the bit line 41 and the second insulating structure 81.

The lower structure U may include a complementary metal oxide semiconductor (CMOS) circuit structure CMOS including a plurality of transistors TR formed on the substrate SUB and a second coupling structure 2nd_CS formed on the CMOS circuit structure CMOS. Isolation layers ISO may be disposed in the substrate SUB, and may isolate junctions of the plurality of transistors TR from each other.

The second coupling structure 2nd_CS may include the second insulating structure 81 formed on the substrate SUB and second connection structures C2 formed in the second insulating structure 81. The second connection structures C2 may respectively include various conductive patterns 83, 85, 87, 89, and 91 embedded in the second insulating structure 81. The second insulating structure 81 may include two or more insulating layers 81A to 81D that are sequentially stacked.

The upper structure T and the lower structure U may be adhered to each other through a bonding process. For example, exposed conductive patterns 67 of the first coupling structure 1st_CS of the upper structure T and exposed conductive patterns 91 of the second coupling structure 2nd_CS of the lower structure U may be disposed to face each other, and may be adhered to each other. The conductive patterns 67 and the conductive patterns 91 may be defined as patterns for bonding metal.

The source line structure SL may be disposed on the upper structure T. The source line structure SL may be configured to include the first source layer SL1, the second source layer SL2, and the third source layer SL3. The first source layer SL1 may be implemented as a doped polysilicon layer. The first source layer SL1 may be formed along the upper surface of the sacrificial substrate SAS, the upper surface of the memory layer ML, the surface of the protrusion of the channel layer 15, and the upper surface of the core insulating layer 11. The first source layer SL1 may be formed to contact the surface of the protrusion of the channel layer 15 and electrically and physically connected to the channel layer 15. The second source layer SL2 may be formed along the upper surface of the first source layer SL1, and may include a titanium (Ti) layer or a titanium nitride (TiN) layer. The second source layer SL2 may be formed such that the opening in the upper portion of the core insulating layer 11 is embedded. The third source layer SL3 may be formed on the second source layer SL2. The third source layer SL3 may be formed of a metal material having low resistance. For example, the third source layer SL3 may be formed of tungsten W, thus reducing the resistance of the source line structure.

The source line structure SL may be used as the source line SL of FIG. 2.

FIGS. 5A to 5F, 6, 7, and 8A to 8D are sectional views for describing a method of manufacturing a semiconductor memory device according to an embodiment of the present disclosure.

FIGS. 5A to 5F are sectional views for describing the step of forming a memory cell array, a first line array, and first connection structures on a first substrate.

Figure 5A:
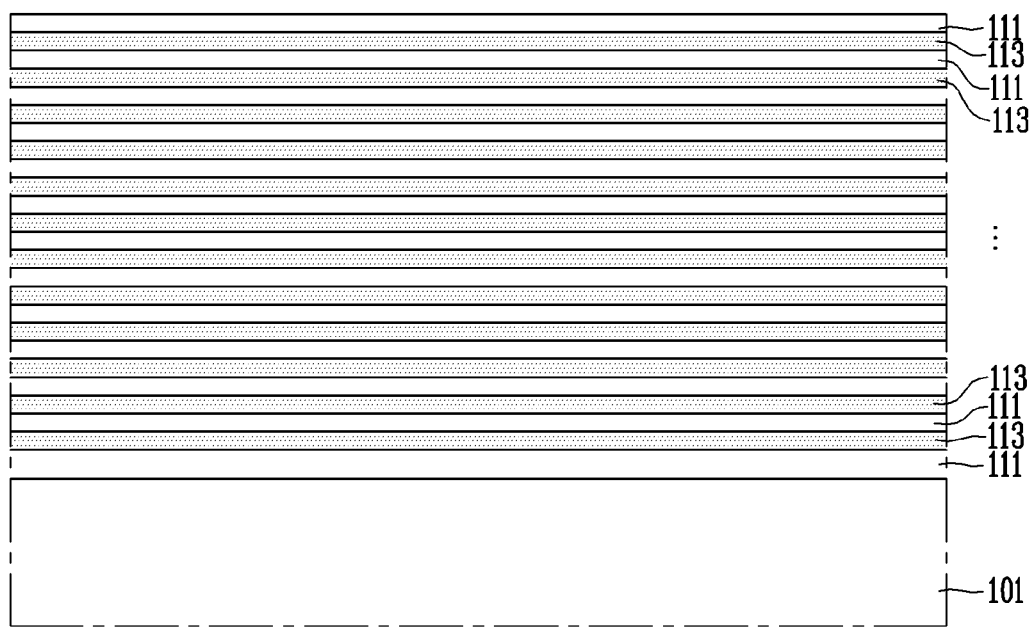
FIGS. 5A to 5F, 6, 7, and 8A to 8D are sectional views for describing a method of manufacturing a semiconductor memory device according to an embodiment of the present disclosure.

Referring to FIG. 5A, first material layers 111 and second material layers 113 may be alternately stacked on top of one another on a first substrate 101.

The first substrate 101 may be formed of a material having an etch rate different from that of the first material layers 111 and the second material layers 113. For example, the first substrate 101 may include silicon.

In an embodiment, the first material layers 111 may be made of an insulating material for the interlayer insulating layers ILD, described above with reference to FIG. 4. The second material layers 113 may be formed of a material having an etch rate different from that of the first material layers 111. For example, the first material layers 111 may include silicon oxide, and the second material layers 113 may include silicon nitride. Although the following drawings illustrate embodiments in which the first material layers 111 are implemented as insulating layers and the second material layers 113 are implemented as sacrificial layers, the present disclosure is not limited thereto. The material properties of the first material layers 111 and the second material layers 113 may be variously changed. For example, the first material layers 111 may be made of an insulating material for the interlayer insulating layers ILD, described above with reference to FIG. 4, and the second material layers 113 may be made of a conductive material for the conductive patterns CP1 to CPn, described above with reference to FIG. 4.

Figure 5B:
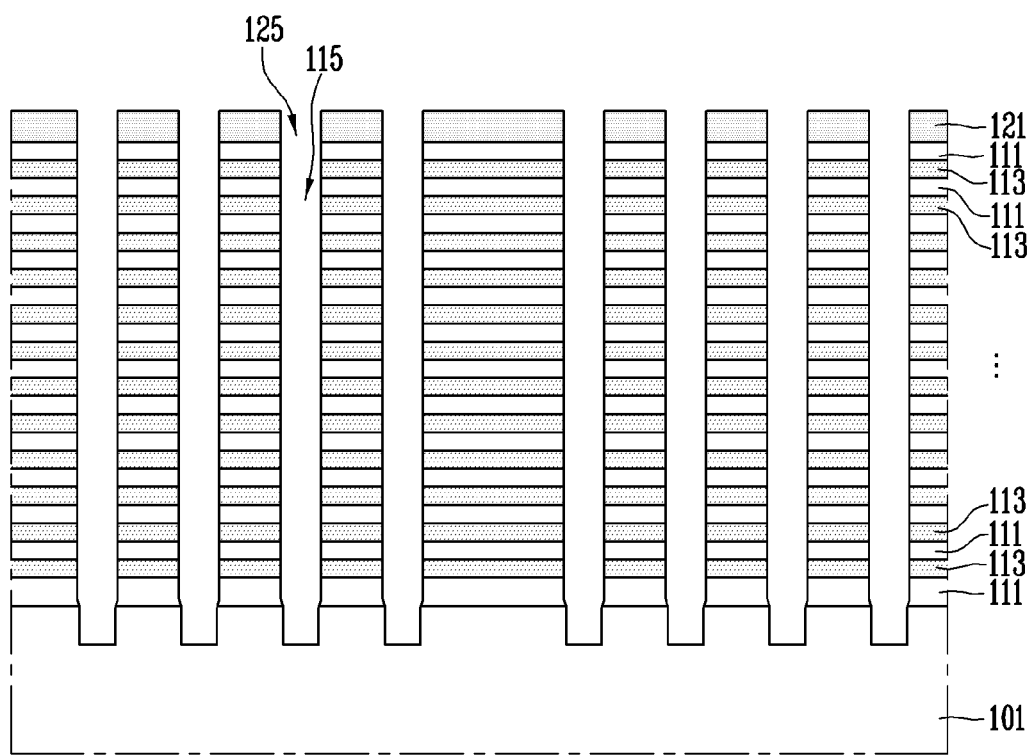

Referring to FIG. 5B, a first mask pattern 121 having therein first openings 125 may be formed on a stacked structure of the first material layers 111 and the second material layers 113. Thereafter, channel holes 115 passing through at least portions of the first material layers 111 and the second material layers 113 may be formed through the first openings 125 in the first mask pattern 121. The channel holes 115 may extend into the first substrate 101 to a certain depth partway through the first substrate 101. The channel holes 115 may be formed in various shapes depending on the etchant that is used to form the channel holes 115.

In an embodiment, the channel holes 115 may be formed using a first etchant. The etch speeds of the first material layers 111 and the second material layers 113 corresponding to the first etchant may be higher than the etch speed of the first substrate 101 corresponding to the first etchant. As a result, the widths of ends of the channel holes 115 extending into the first substrate 101 may be formed to be smaller than those of the channel holes 115 passing through the first material layers 111 and the second material layers 113.

Figure 5C:
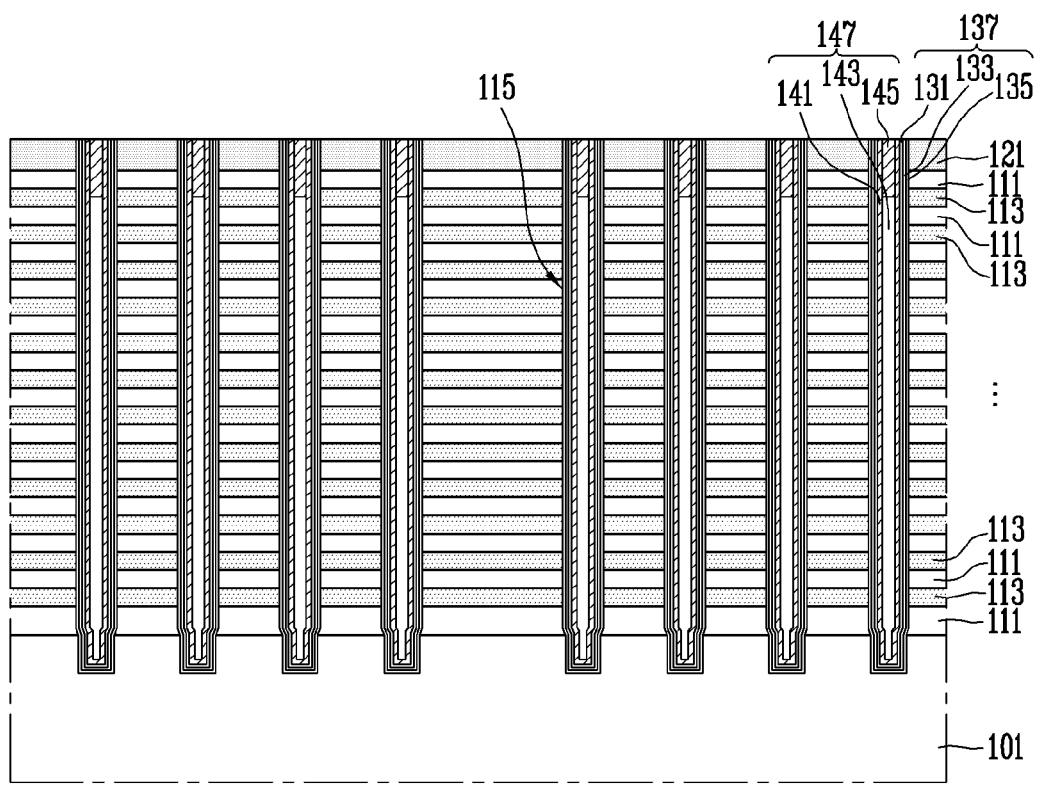

Referring to FIG. 5C, a memory layer 137 and a channel structure 147 may be formed in each of the channel holes 115. The sidewall of the channel structure 147 and the end of the channel structure 147 extending into the first substrate 101 may be enclosed by the memory layer 137.

The step of forming the memory layer 137 may include the step of sequentially stacking a blocking insulating layer 135, a data storage layer 133, and a tunnel insulating layer 131 on the surfaces of the channel holes 115. The blocking insulating layer 135, the data storage layer 133, and the tunnel insulating layer 131 may respectively include the same materials as the blocking insulating layer BI, the data storage layer DS, and the tunnel insulating layer TI, described above with reference to FIG. 4. The memory layer 137 may be formed in a liner shape, and central regions of the channel holes 115 may be defined by the memory layer 137.

Thereafter, a channel layer 141 may be formed on the surface of the memory layer 137, and then the channel structure 147 may be formed. The channel layer 141 may include a semiconductor layer used as a channel area. For example, the channel layer 141 may include undoped polysilicon.

In an embodiment, the channel layer 141 may be formed in a liner shape, and the central regions of the channel holes 115 may include portions that are not filled with the channel layer 141. When the channel layer 141 is formed in a liner shape, the step of forming the channel structure 147 may include the step of filling the central regions of the channel holes 115 with a core insulating layer 143 on the channel layer 141, the step of etching a portion of the core insulating layer 143 and defining a recess region in a portion of the central region of each channel hole 115, and the step of filling the recess region with a doped semiconductor layer 145. The core insulating layer 143 may include an oxide, and the doped semiconductor layer 145 may include a conductive dopant. The conductive dopant may include an n-type dopant for junctions. The conductive dopant may include a counter-doped p-type dopant.

In other embodiments, the channel layer 141 may be formed to fill the central regions of the channel holes 115, wherein the core insulating layer 143 and the doped semiconductor layer 145 may be obviated. When the core insulating layer 143 and the doped semiconductor layer 145 are omitted, the step of forming the channel structure 147 may further include the step of doping the channel layer 141 with the conductive dopant.

Figure 5D:
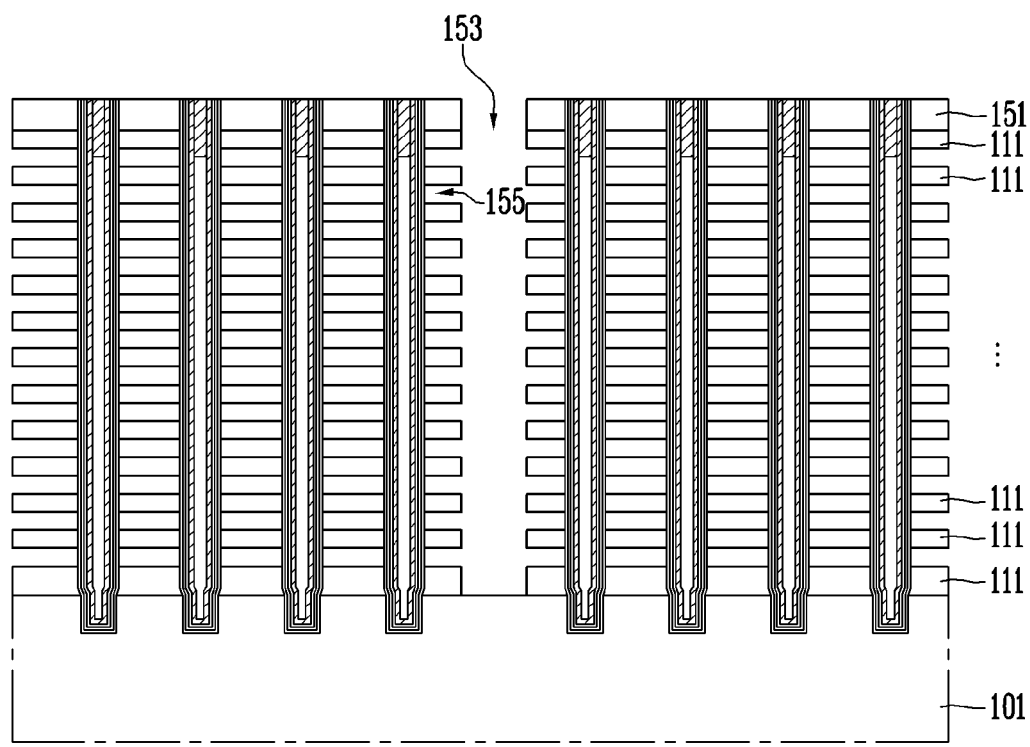

Referring to FIG. 5D, after the first mask pattern 121 of FIG. 5C is removed, a first insulating layer 151 may be formed.

Then, a slit 153 may be formed. The slit 153 may pass through the first insulating layer 151, and may also pass through the stacked structure of the first material layers 111 and the second material layers 113. The slit 153 may correspond to the slit SI illustrated in FIG. 4. Next, the second material layers 113 exposed through the slit 153 may be selectively removed, and thus horizontal spaces 155 may be defined. The horizontal spaces 155 may be defined between the first material layers 111 adjacent to each other in a vertical direction.

Figure 5E:
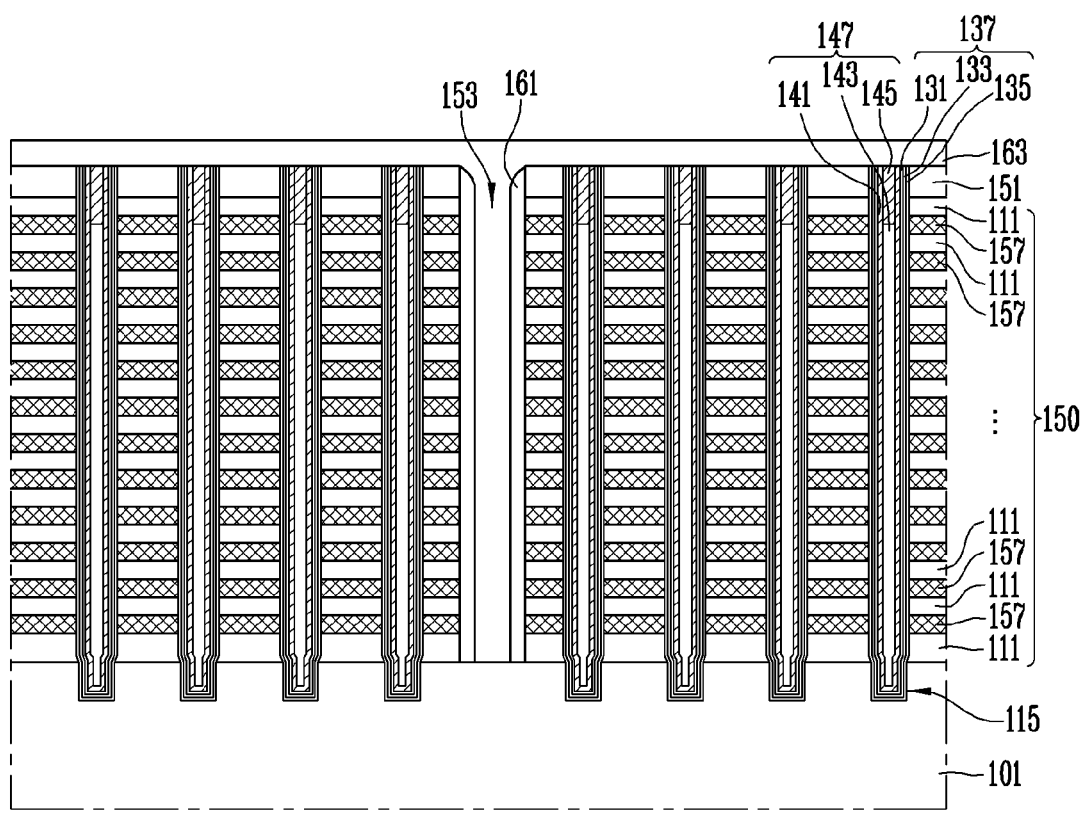

Referring to FIG. 5E, the horizontal spaces 155 illustrated in FIG. 5D may be filled with third material layers 157, respectively, through the slit 153. The third material layers 157 may be the conductive patterns CP1 to CPn, described above with reference to FIG. 4. The third material layers 157 may fill the horizontal spaces 155 to enclose the channel structure 147 and the memory layer 137.

As described above, a gate stacked body 150 may be formed on the first substrate 101 by replacing the second material layers 113 as sacrificial layers with the third material layers 157 as conductive patterns. The gate stacked body 150 may include a structure in which the first material layers 111 as interlayer insulating layers and the third material layers 157 as conductive patterns are alternately stacked. The gate stacked body 150 may be at least partially penetrated by the channel structure 147, and the channel structure 147 may extend into the first substrate 101. The memory layer 137 may extend from an area between the channel structure 147 and the gate stacked body 150 to an area between the end of the channel structure 147 and the first substrate 101.

Through the processes described above with reference to FIGS. 5A to 5E, a memory block including the plurality of cell strings CS1 and CS2, described above with reference to FIG. 3, may be formed on the first substrate 101. As described above with reference to FIG. 3, each of the cell strings may include a drain select transistor DST and memory cells MC1 to MCn, which are connected in series to each other. The drain select transistor DST and the memory cells MC1 to MCn, described above with reference to FIG. 3, may be defined in intersection regions between the channel structure 147 of FIG. 5E and the third material layers 157 as the conductive patterns, and may be connected in series by the channel structure 147.

Next, a sidewall insulating layer 161 covering the sidewall of the gate stacked body 150 may be formed. Thereafter, a second insulating layer 163, extending to fill the slit 153 and to cover the sidewall insulating layer 161 and the first insulating layer 151, may be formed.

Figure 5F:
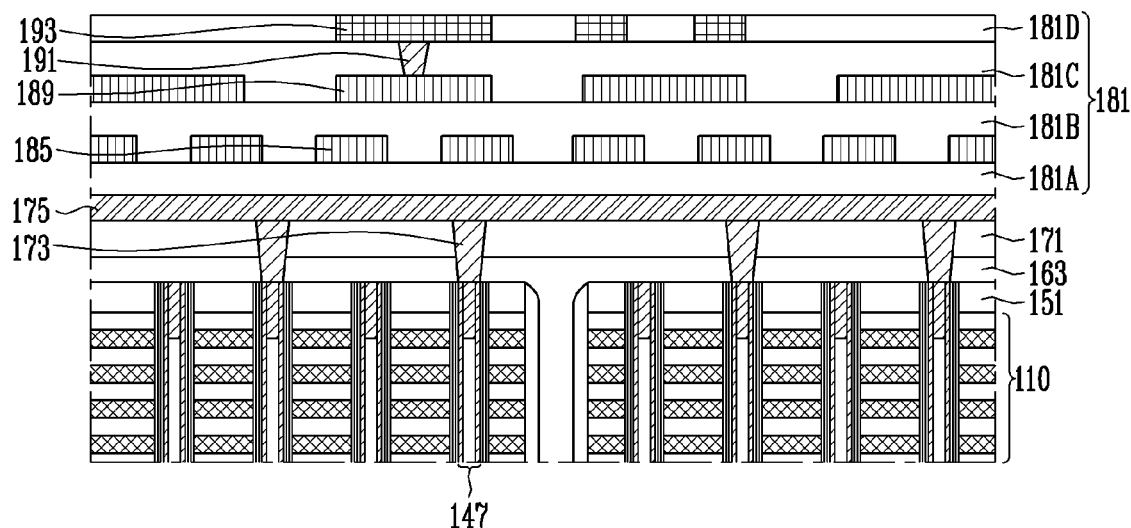

Referring to FIG. 5F, a third insulating layer 171 may be formed on the second insulating layer 163. Thereafter, contact plugs 173 which penetrate the third insulating layer 171 or penetrate at least portions of the third insulating layer 171 and the second insulating layer 163 may be formed. The contact plugs 173 may extend to contact the channel structure 147.

Next, a first line array 175 may be formed. The first line array 175 may be a bit line coupled to the contact plugs 173. Thereafter, a first insulating structure 181 covering the first line array 175 may be formed. The first insulating structure 181 may include two or more insulating layers, with four layers 181A to 181D being shown. First connection structures 185, 189, 191, and 193 may be embedded in the first insulating structure 181, and may be electrically connected to each other via contact plugs (not illustrated).

The first connection structures 185, 189, 191, and 193 may include a first bonding metal material 193 having a surface exposed to the outside of the first insulating structure 181.

Figure 6:
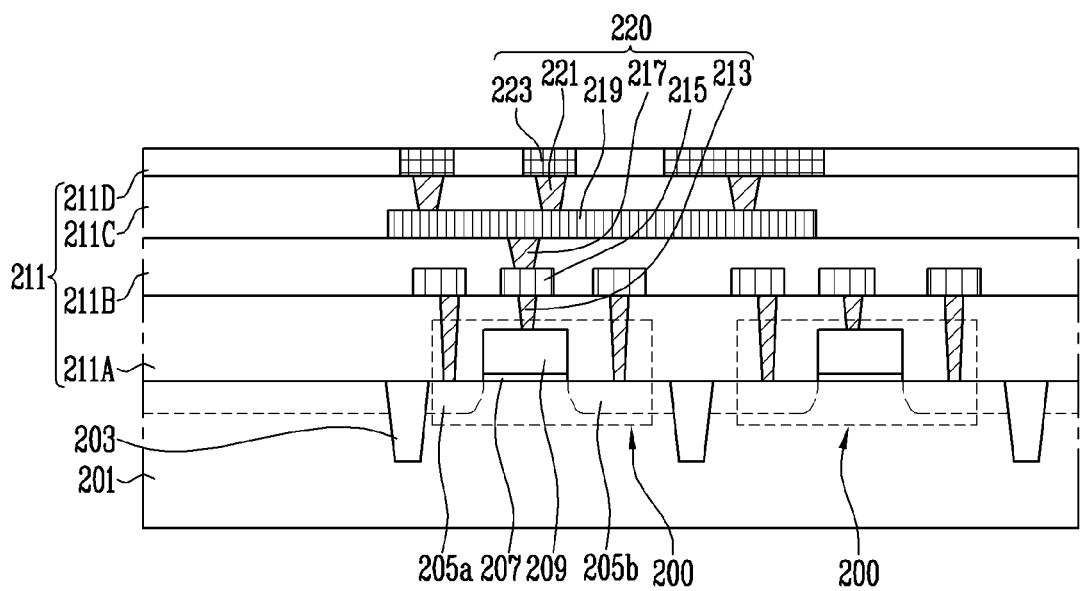

FIG. 6 is a sectional view for describing the step of forming a CMOS circuit and second connection structures on a second substrate.

Referring to FIG. 6, a plurality of transistors 200 constituting a complementary metal oxide semiconductor (CMOS) circuit may be formed on a second substrate 201.

The second substrate 201 may be a bulk silicon substrate, a silicon-on-insulator substrate, a germanium substrate, a germanium-on-insulator substrate, a silicon-germanium substrate, or an epitaxial layer substrate formed using a selective epitaxial growth method.

The transistors 200 may be formed in respective active areas of the second substrate 201 separated by an isolation layer 203. Each of the transistors 200 may include a gate insulating layer 207 and a gate electrode 209 stacked in the active area corresponding thereto and junctions 205a and 205b formed in active areas disposed on both sides of the gate electrode 209. Each of the junctions 205a and 205b may include a conductive dopant for implementing a transistor corresponding thereto. Each of the junctions 205a and 205b may include at least one of an n-type dopant and a p-type dopant.

After the plurality of transistors 200 are formed, second connection structures 220 coupled to the transistors 200 constituting the CMOS circuit, and a second insulating structure 211 configured to cover the second connection structures 220 and the transistors 200 may be formed.

The second insulating structure 211 may include two or more insulating layers, with four layers 211A to 211D being shown. The second connection structures 220 may be embedded in the second insulating structure 211. Each of the second connection structures 220 may include a plurality of conductive patterns 213, 215, 217, 219, 221, and 223. The second insulating structure 211 and the second connection structures 220 may be changed in various forms without being limited to the example illustrated in the drawing.

The conductive patterns 213, 215, 217, 219, 221, and 223 included in each of the second connection structures 220 may include a second bonding metal material 223 having a surface exposed to the outside of the second insulating structure 211.

Figure 7:
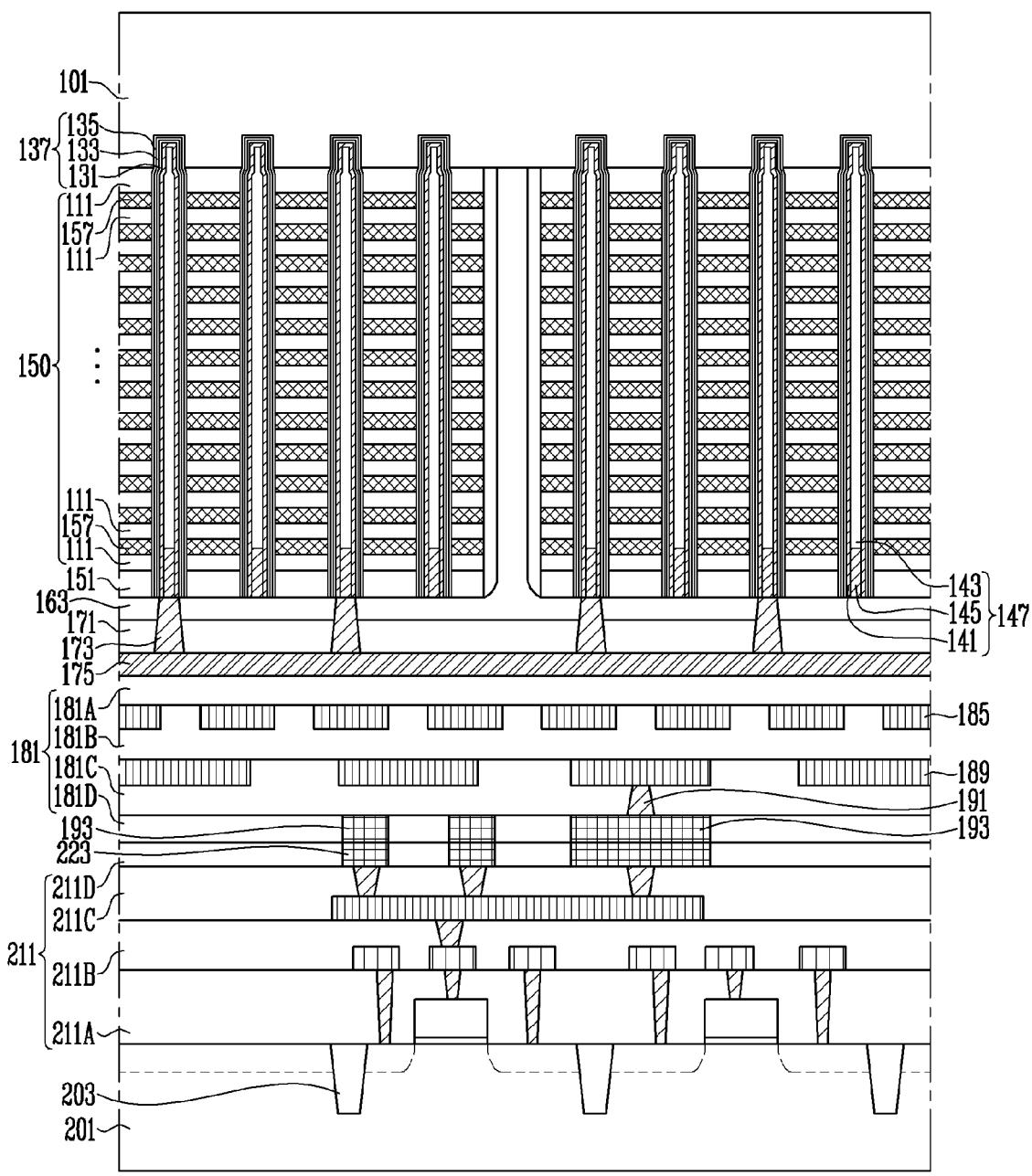

FIG. 7 is a sectional view for describing the step of adhering the first connection structures and the second connection structures to each other.

Referring to FIG. 7, the first substrate 101 and the second substrate 201 are aligned such that a first bonding metal material 193 on the first substrate 101 and a second bonding metal material 223 on the second substrate 201 come into contact with each other. The first bonding metal material 193 and the second bonding metal material 223 may contain various types of metal materials, for example, copper.

Thereafter, the first bonding metal material 193 and the second bonding metal material 223 are adhered to each other. For this, after heat is applied to the first bonding metal material 193 and the second bonding metal material 223, the first bonding metal material 193 and the second bonding metal material 223 may be hardened. The present disclosure is not limited thereto, and various processes for coupling the first bonding metal material 193 and the second bonding metal material 223 to each other may be introduced.

FIGS. 8A to 8D are sectional views for describing the step of forming a source line structure coupled to a plurality of cell strings on a gate stacked body 150.

Figure 8A:
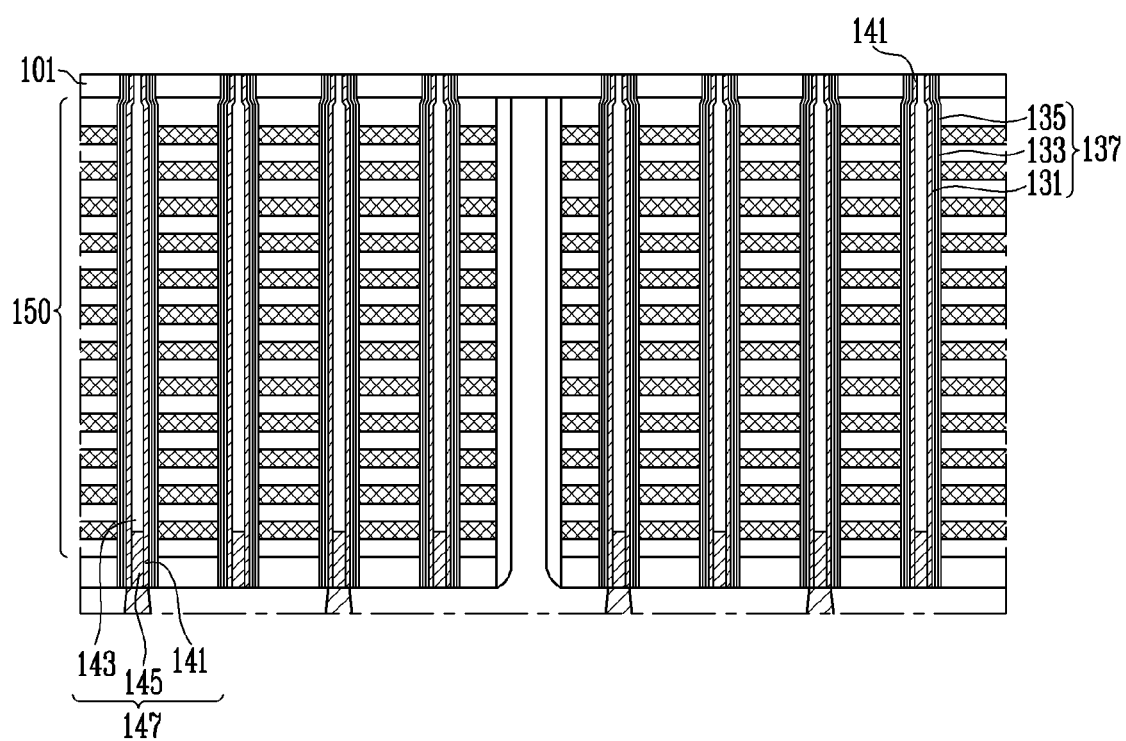

Referring to FIG. 8A, the first substrate 101, the memory layer 137, and the channel layer 141 of FIG. 7 are etched, thus exposing the uppermost portion of the core insulating layer 143. For example, an etching process may be performed using a chemical mechanical polishing (CMP) process. For example, the first substrate 101, the memory layer 137, and the channel layer 141 may be etched such that the uppermost portion of the core insulating layer 143 is exposed using the CMP process.

Figure 8B:
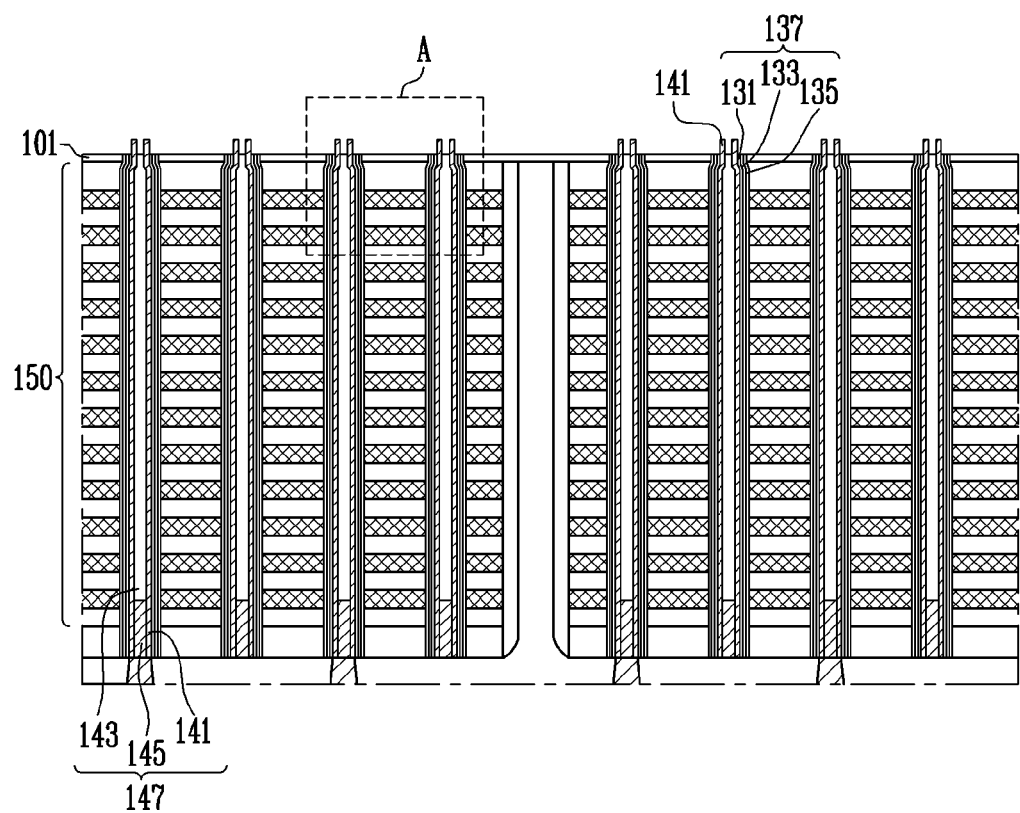

Referring to FIG. 8B, the exposed upper portion of the core insulating layer 143 is etched to a certain thickness, thus causing the upper portion of the channel layer 141 to protrude. For example, the etching process may be performed using a wet etching process. For example, the upper portion of the core insulating layer 143 is etched to a certain thickness using the wet etching process, whereby the memory layer 137 and the first substrate 101 may also be etched to a predetermined degree.

Thereafter, a description will be made with reference to the drawing in which region A is enlarged.

Figure 8C:
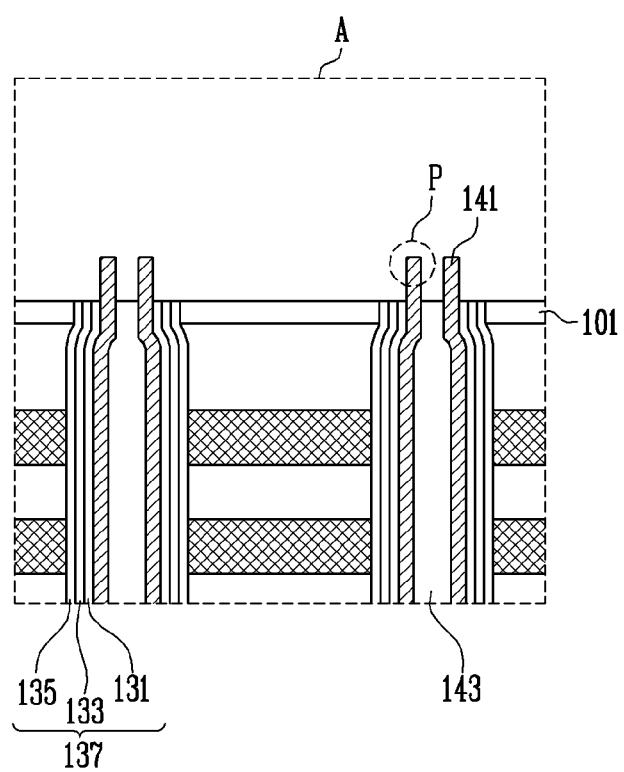

Referring to FIG. 8C, the channel layer 141 exposed by performing an etching process may have a protrusion P. An opening defined by the protrusion P of the channel layer 141 may be formed in the upper portion of the insulating layer 143.

Thereafter, a junction area may be formed by performing an ion implantation process and by implanting a dopant into the channel layer 141 used as the channel of the source select transistor.

Figure 8D:
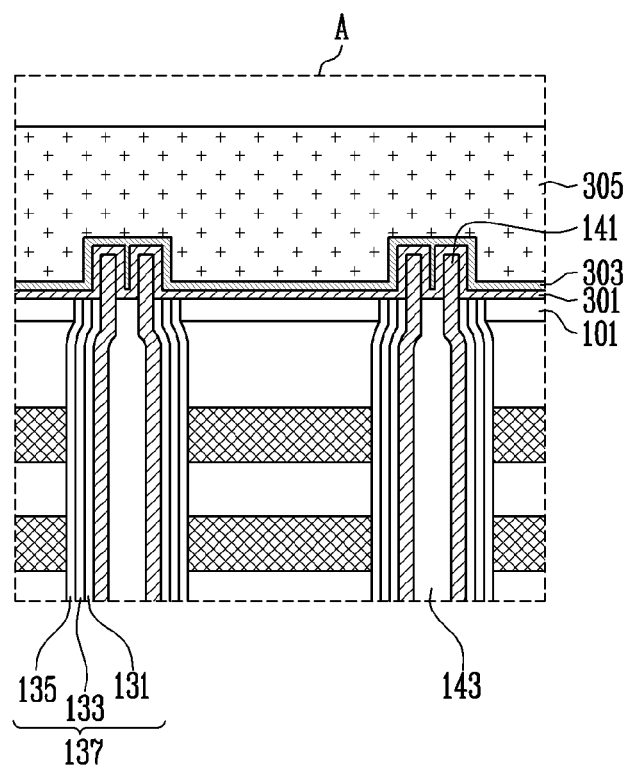

Referring to FIG. 8D, a first source layer 301 is formed along the upper surface of the entire structure including the protrusion of the channel layer 141. The first source layer 301 may be implemented as a doped polysilicon layer. The first source layer 301 may be formed to contact the upper surface of the first substrate 101, the upper surface of the memory layer 137, and the surface of the protrusion of the channel layer 141.

Thereafter, a second source layer 303 may be formed along the upper surface of the first source layer 301, and the second source layer 303 may include a titanium (Ti) layer or a titanium nitride (TN) layer. The second source layer 303 may be formed to fill the opening in the upper portion of the core insulating layer 143.

Thereafter, a third source layer 305 may be formed on the second source layer 303. The third source layer 305 may be formed of a metal material having low resistance. For example, the third source layer 305 may be formed of tungsten W, thus reducing the resistance of the source line structure.

In accordance with an embodiment of the present disclosure, the core insulating layer may be etched to a certain thickness so that the channel layer of the channel structure protrudes during a process for etching the first substrate. Therefore, during a process for coupling the channel layer to the source layer, the process may be performed such that the protrusion of the channel layer and the source layer contact each other, and thus the coupling process may be more easily performed.

Figure 9:
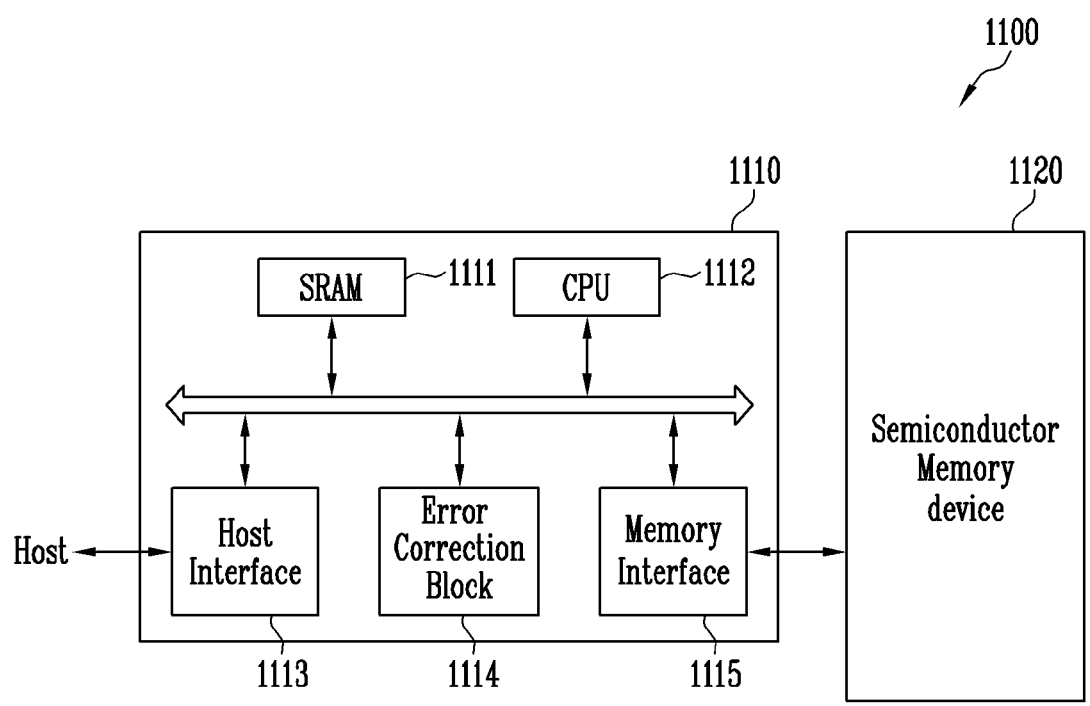
FIG. 9 is a block diagram illustrating a configuration of a memory system according to an embodiment of the present disclosure.

FIG. 9 is a block diagram illustrating the configuration of a memory system 1100 according to an embodiment of the present disclosure.

Referring to FIG. 9, the memory system 1100 includes a semiconductor memory device 1120 and a memory controller 1110.

The semiconductor memory device 1120 may be a multi-chip package composed of a plurality of flash memory chips. In an embodiment, the semiconductor memory device 1120 may be the semiconductor memory device 10 described with reference to FIGS. 1 to 4.

The memory controller 1110 may control the semiconductor memory device 1120, and may include static random access memory (SRAM) 1111, a central processing unit (CPU) 1112, a host interface 1113, an error correction block 1114, and a memory interface 1115. The SRAM 1111 may be used as working memory of the CPU 1112, the CPU 1112 may perform overall control operations for data exchange of the memory controller 1110, and the host interface 1113 may be provided with a data interchange protocol of a host coupled to the memory system 1100. Further, the error correction block 1114 may detect and correct an error included in data that is read from the semiconductor memory device 1120, and the memory interface 1115 may interface with the semiconductor memory device 1120. In addition, the memory controller 1110 may further include read only memory (ROM) or the like that stores code data for interfacing with the host.

The above-described memory system 1100 may be a memory card or a solid state drive (SSD) in which the semiconductor memory device 1120 and the memory controller 1110 are combined with each other. For example, when the memory system 1100 is an SSD, the memory controller 1110 may communicate with an external device (e.g., host) through one of various interface protocols, such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and an Integrated Drive Electronics (IDE).

Figure 10:
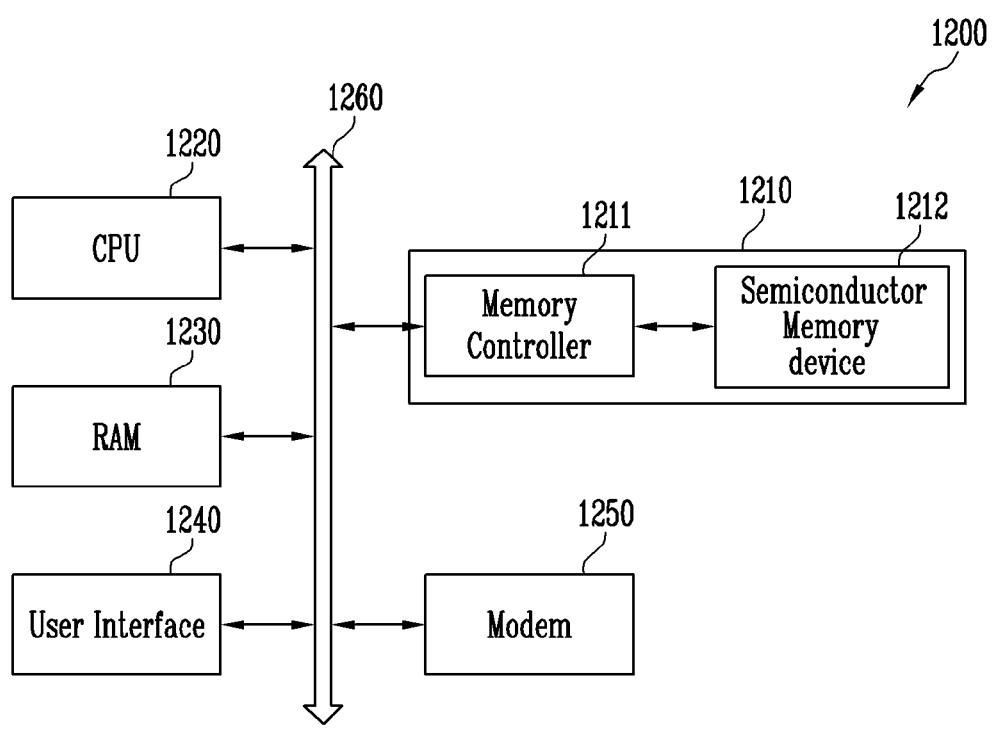
FIG. 10 is a block diagram illustrating a configuration of a computing system according to an embodiment of the present disclosure.

FIG. 10 is a block diagram illustrating the configuration of a computing system according to an embodiment of the present disclosure.

Referring to FIG. 10, the computing system 1200 according to an embodiment of the present disclosure may include a CPU 1220, random access memory (RAM) 1230, a user interface 1240, a modem 1250, and a memory system 1210, which are electrically connected to a system bus 1260. Also, when the computing system 1200 is a mobile device, it may further include a battery for supplying an operating voltage to the computing system 1200, and may further include an application chip set, a camera image processor (CIS), a mobile DRAM, etc.

In accordance with the present disclosure, during a process for coupling a channel layer having a vertical channel structure to a source layer, the core insulating layer of the channel structure is exposed and then etched to a certain depth so that the channel layer protrudes. Thus, the source layer contacting the protruding channel layer may be easily formed.

While the presented embodiments of the present disclosure have been disclosed for illustrative purposes, those skilled in the art will appreciate that various modifications, additions, and/or substitutions are possible. Therefore, the scope of the present disclosure should be defined by the appended claims and equivalents of the claims rather than by the description preceding them.

What is claimed is:

1. A semiconductor memory device, comprising:
    a gate stacked body including interlayer insulating layers and conductive patterns that are alternately stacked on a substrate in a vertical direction;
    a channel structure penetrating at least a portion of the gate stacked body and having a first end protruding upward higher than the gate stacked body;
    a memory layer enclosing a sidewall of the channel structure; and
    a source layer formed on the gate stacked body,
    wherein the channel structure comprises:
        a core insulating layer formed in a central region of the channel structure and extending in a vertical direction; and
        a channel layer enclosing a sidewall of the core insulating layer and formed to be higher than the core insulating layer and the memory layer in the vertical direction.

2. The semiconductor memory device according to claim 1, wherein an uppermost portion of the channel structure includes an opening defined by the channel layer protruding higher than the core insulating layer.

3. The semiconductor memory device according to claim 2, wherein the source layer comprises:
    a first source layer formed along an upper portion of the gate stacked body and a surface of the protruding first end of the channel structure; and
    a second source layer formed on the first source layer.

4. The semiconductor memory device according to claim 3, wherein the first source layer and the second source layer are formed to fill the opening.

5. The semiconductor memory device according to claim 3, wherein the source layer further comprises a third source layer formed on the second source layer.

6. The semiconductor memory device according to claim 5, wherein:
    the first source layer includes a doped polysilicon layer,
    the second source layer includes a titanium layer or a titanium nitride layer, and
    the third source layer includes a tungsten layer.

7. The semiconductor memory device according to claim 3, wherein:
    the channel layer includes a protrusion protruding upward higher than the core insulating layer and the memory layer, and
    the first source layer is directly coupled to the protrusion of the channel layer.

8. The semiconductor memory device according to claim 3, further comprising a sacrificial substrate disposed between the first source layer and the gate stacked body.

9. A semiconductor memory device, comprising:
    a gate stacked body including interlayer insulating layers and conductive patterns that are alternately stacked on a substrate in a vertical direction;
    a sacrificial substrate formed on the gate stacked body;
    a channel structure penetrating at least a portion of the gate stacked body and the sacrificial substrate, the channel structure having a first end protruding upward from the sacrificial substrate;
    a memory layer enclosing a sidewall of the channel structure; and
    a source layer formed on the gate stacked body,
    wherein the protruding first end of the channel structure includes an opening.

10. The semiconductor memory device according to claim 9, wherein the channel structure comprises:
    a core insulating layer formed in a central region of the channel structure and extending in a vertical direction; and
    a channel layer enclosing a sidewall of the core insulating layer and formed to be higher than the core insulating layer and the memory layer in the vertical direction.

11. The semiconductor memory device according to claim 10, wherein:
    the channel layer includes a protrusion protruding upward higher than the core insulating layer and the memory layer, and
    the source layer is directly coupled to the protrusion of the channel layer.

12. The semiconductor memory device according to claim 11, wherein the opening is defined by the protrusion of the channel layer and an upper portion of the core insulating layer.

* * * * *